(12) United States Patent
Hung et al.

(10) Patent No.: US 8,259,484 B2
(45) Date of Patent: Sep. 4, 2012

(54) 3D CHIP SELECTION FOR SHARED INPUT PACKAGES

(75) Inventors: Chun-Hsiung Hung, Hsinchu (TW); Hsin-Yi Ho, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 261 days.

(21) Appl. No.: 12/768,620

(22) Filed: Apr. 27, 2010

(65) Prior Publication Data
US 2011/0157951 A1    Jun. 30, 2011

(30) Foreign Application Priority Data
Dec. 30, 2009  (TW) ................ 98145933 A

(51) Int. Cl.
*G11C 5/06*    (2006.01)
(52) U.S. Cl. .................... 365/63; 365/230.06
(58) Field of Classification Search ............ 365/63, 365/230.06
See application file for complete search history.

(56) References Cited

U.S. PATENT DOCUMENTS

| 6,792,365 | B2 | 9/2004 | Raitter |
| 6,999,854 | B2* | 2/2006 | Roth ............................ 700/282 |
| 7,327,592 | B2 | 2/2008 | Silvestri |
| 7,343,214 | B2 | 3/2008 | Koh |
| 7,477,535 | B2 | 1/2009 | Lahtinen et al. |
| 7,555,358 | B2 | 6/2009 | Jones et al. |
| 2010/0131684 | A1* | 5/2010 | Johnson ...................... 710/104 |

* cited by examiner

*Primary Examiner* — Michael Tran
(74) *Attorney, Agent, or Firm* — Haynes Beffel & Wolfeld LLP

(57) ABSTRACT

A multi-chip package with die having shared input and unique access IDs. A unique first ID is assigned and stored on die in a die lot. A set of die is mounted in a multi-chip package. Free access IDs are assigned by applying a sequence of scan IDs on the shared input. On each die, the scan ID on the shared input is compared with the unique first ID stored on the die. Upon detecting a match, circuitry on the die is enabled for a period of time to write an access ID in nonvolatile memory, whereby one of the die in the multi-chip package is enabled at a time. Also, the shared input is used to write a free access ID in nonvolatile memory on the one enabled die in the set. The unique first IDs can be stored during a wafer level sort process.

11 Claims, 5 Drawing Sheets

3D CHIP SELECTION FOR SHARED INPUT PACKAGES

PRIORITY CLAIM

Related Application

This application claims the benefit under Title 35, United States Code, §119 of Taiwan Application No. 098145933 filed on 30 Dec. 2009.

BACKGROUND OF THE INVENTION

1. Field of the Invention

The present invention relates to multi-chip assemblies and packages having shared inputs, such as packages for 3D integration of integrated circuit chips, and to integrated circuits for such use.

2. Description of Related Art

Three-dimensional (3D) packaging technologies have been developed in which multiple integrated circuits are integrated in a single package or other assembly. For example, multiple memory chips can be stacked to increase the density of memory within a given footprint on a printed circuit board. Typically, memory chips stacked in this way share the same control, address and/or data signals. Thus, an issue is created concerning how to access one of the stacked die at a time, such as is needed for reading and writing data to a memory array on one of the die but not on others. This can be done by special handling of the individual die before packaging, which can be costly and complex. For example, one might implement a process of marking each die on a wafer with a unique identifier ID during the manufacture of the wafer, using unique lithographic patterns for each die, such as in a metal layer, to configure a decoder on each die for use in a specific layer in a 3D stack. Then each die must be tracked according to the configuration of the decoder. This approach increases the costs of the lithographic masks and is complex to implement in practice.

U.S. Pat. No. 7,327,592, entitled Self-Identifying Stacked Die Semiconductor Components, by Silvestri, is incorporated herein by reference for disclosure of background information. According to Silvestri, the individual chips in a stack of chips are identified by the arrangement of "external control connections" implemented using micro-balls between the chips. Special decoders are connected to the micro-balls to provide for unique selection of the individual chips in the stack. This allows use of any die from a given wafer at any position in a stack. However, it requires relatively large area on each die, consumes a number of the limited amount of chip-to-chip connections and complicates the packaging process.

It is desirable to provide an integrated circuit design and a process for manufacturing by which each die in a wafer can be undistinguished during manufacture of the wafer, and can be mounted in any order in undistinguished, multi-chip packages, while allowing for distinguishing individual die during operation after packaging.

SUMMARY OF THE INVENTION

An integrated circuit device is described which includes a set of die in a multi-chip package, such as a package using 3D integration, in which the die are coupled to shared input. The set of die has an operating mode relying on selecting individual die in the set, such as for selecting an individual die in a 3D memory device. Each die in the set includes a nonvolatile memory adapted to store a first ID unique within a lot of die ("scan ID"), and to store a second ID unique within the set of die in the multi-chip package ("access ID"). Control logic on the die compares an input scan ID on the shared input lines to the first ID stored in the nonvolatile memory, and in response to a match, enables writing of the second ID to the nonvolatile memory. The control logic can include logic on the die is responsive to a first command on the shared input to compare an input scan ID to an assigned first ID stored in a nonvolatile memory and, in response, to match to enable writing of the second ID to nonvolatile memory. Also, logic is included on the die that is responsive to a second command to write the assigned second ID received on shared input to the nonvolatile memory in the enabled die. Logic on the chip is responsive to commands on the shared input lines based on the assigned second ID stored in the nonvolatile memory.

Also, techniques are described in which die in the set of die mounted in the multi-chip package are selected from a lot that includes die on a wafer, and each die includes logic capable of writing the first ID to the nonvolatile memory before separation of the die from the wafer, such as during a wafer sort/test stage of manufacturing.

A method for manufacturing a multi-chip package is described, where the multi-chip packages include die having shared input and having respective access IDs that distinguish among die in the package. The process includes storing unique first IDs on die in a die lot. Next, a set of die selected from the die lot is mounted in a multi-chip package such that the die have shared input. Next, a process is executed for assigning free access IDs to the set of die, where the free access IDs are selected from a set of access IDs for the die in the package until all of the access IDs are assigned.

The process for assigning access IDs includes applying a sequence of scan IDs on the shared input. On each die in the set, the scan ID on the shared input is compared with a first ID stored on the die that is unique to die in the lot. Upon detecting a match, a scan ID match is signaled, and circuitry on the die is enabled for a period of time to write an access ID in nonvolatile memory, whereby one of the die in the multi-chip package is enabled at a time. Also, when a scan ID match is signaled, the shared input is used to write a free access ID in nonvolatile memory on the one enabled die in the set. The process is continued until the set of access IDs for the package is successfully assigned, or process fails.

A technique for storing the unique first IDs on the die in a lot is described which includes executing a wafer level sort process that applies a test suite, and stores unique first IDs in nonvolatile memory on die which pass the test suite.

Also, the multi-chip package can be operated according to a method including receiving a command having a first part indicating an operation mode and a second part indicating an access ID; and comparing the access ID with the assigned ID of each die and responding to the command upon a matching die. Such command can be received on input shared by the die on the multi-chip package. Such command can be received on a serial input shared by the die on the multi-chip package.

According to the techniques described herein, die intended for mounting in multi-chip packages can be manufactured in a manner which does not distinguish among the die on a wafer. The die within a lot are distinguished during a wafer sort/test process by assigning unique scan IDs. Also, the die having unique scan IDs can be mounted in a multi-chip packages in a manner which does not distinguish among the die in the package. Access IDs for the die within the multi-chip packages are assigned using a process relying on the unique scan IDs.

Therefore, using the technology described herein, die can be manufactured in a wafer fab without previously specifying the number of die to be used together in a single multi-chip package, and without previously specifying the order in which the die are mounted in the package. Also, the die can be configured into the multi-chip package without distinguishing among the die in terms of the manner in which the inputs are connected, or the order in which the die are arranged.

Other aspects and advantages of the present invention can be seen on review of the drawings, the detailed description and the claims, which follow.

DETAILED DESCRIPTION

A detailed description of embodiments of the present invention is provided with reference to the FIGS. 1-8.

Figure 1:
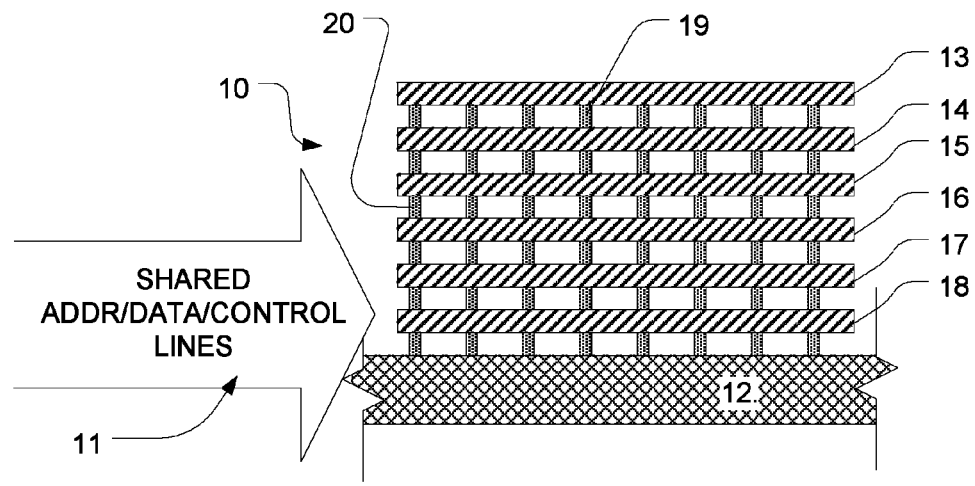
FIG. 1 is an illustration of a prior art multi-chip package including stacked die with shared input.

FIG. 1 shows a prior art multi-chip package 10 for a plurality of die 13-18, having shared input 11 which carries for example address, data and control signals to die 13-18 in the package 10. The die are interconnected using vertical connections 19, 20, or other technology by which the shared input 11 is coupled to all of the die 13-18 in the stack. In this situation, a technique must be provided to distinguish between the die in the stack.

Figure 2:
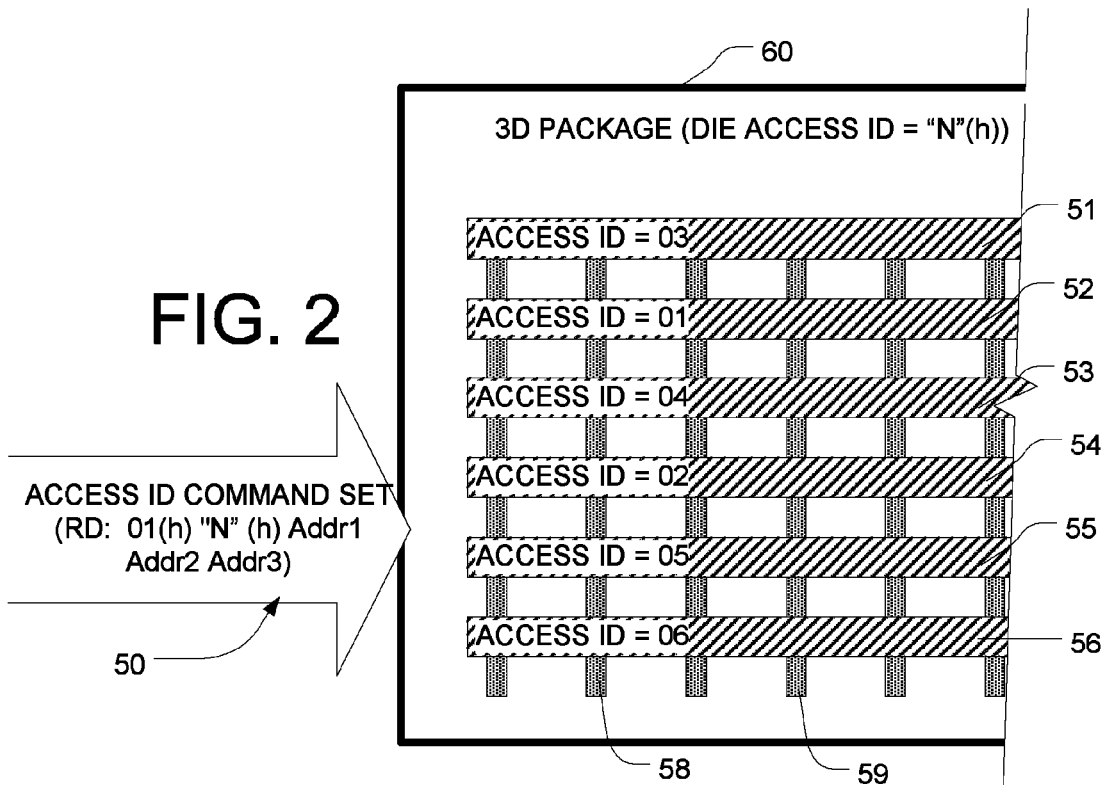
FIG. 2 illustrates a multi-chip package as described herein where each die in the package has a unique access ID, and is responsive to a command set received on shared input based on the access ID.

FIG. 2 illustrates a multi-chip package 60 implemented as described herein with shared input 50, where each of the die 51-56 mounted in the package 60 has a unique access ID stored in nonvolatile memory on the die. Otherwise the individual die 51-56 are undistinguished, having circuitry designed to react to the shared input 50. The die 51-56 are interconnected using 3D integration techniques represented by the lines between the chips, such as lines 58 and 59. Each die has circuitry which decodes a command set based on the access ID. In embodiments where the individual die 51-56 comprise integrated circuit memory devices, a command in the command set may comprise a read command of the form requiring a prespecified sequence of data on the shared input. In one example, a read command includes a sequence of bytes, including a first byte 01 (hex), a second byte carrying an access ID "N", a third byte Addr1 carrying a first byte of an address, a fourth byte Addr2 carrying a second byte of an address, and a fifth byte Addr3 carrying a third byte of the address. The command sequence is applied to the shared input and received by all of the die in the package. Because each of the die in the package has a unique access ID stored thereon, it is able to properly decode and react to the command.

Note that the access IDs can be, but are not necessarily, assigned in the same order that the die are stacked. Thus, in FIG. 2, the top die 51 has access ID=03, the next the die has access ID=01, the next die 53 has access ID=04, the next die 54 has access ID=02, the next die 55 has access ID=05, and the next die 56 has access ID=06. The sequence of access IDs occurs as a result of the process used for assigning them as described below.

Figure 3:
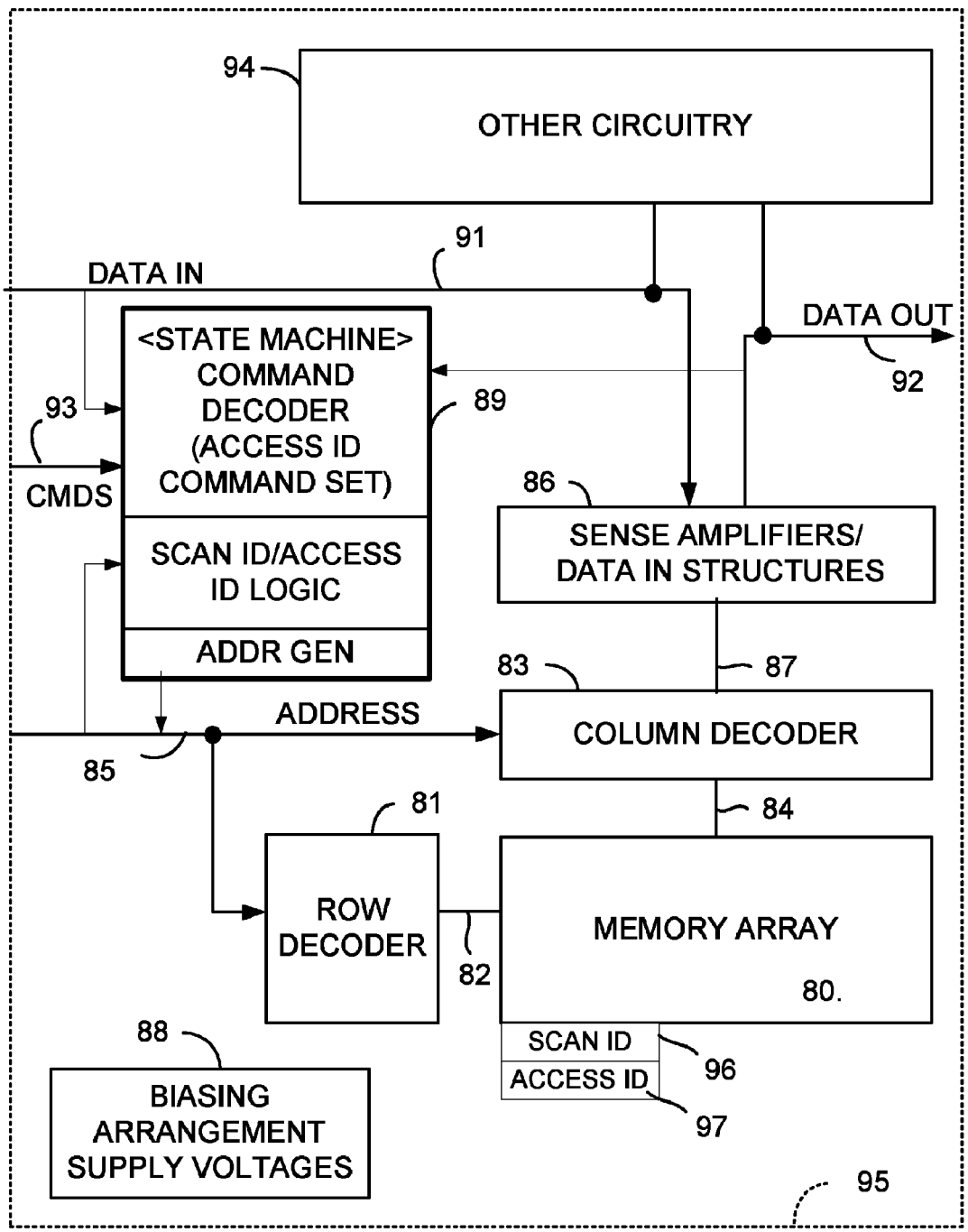
FIG. 3 is a simplified block diagram of an integrated circuit die suitable for use in a multi-chip package as shown in FIG. 2.

FIG. 3 is a simplified block diagram of an integrated circuit on a die 95 suitable for mounting in a multi-chip package as described herein. The integrated circuit as manufactured and as packaged, is undistinguished relative to other die that could be mounted in the same package. The integrated circuit includes logic for assigning a unique access ID to the die after it has been packaged as described herein. The integrated circuit on die 95 in this example includes a memory array 80 on a semiconductor substrate. In one example, the memory array 80 comprises a flash memory including an array of nonvolatile memory cells. A row decoder 81 is coupled to a plurality of word lines 82, and arranged along rows in the memory array 80. A column decoder 83 is coupled to a plurality of bit lines 84 arranged along columns in the memory array 80 for reading and programming data from the memory cells in the array 80. Addresses are supplied on bus 85 to column decoder 83 and row decoder 81. Sense amplifiers and data-in structures in block 86 are coupled to the column decoder 83 in this example via data bus 87. Data is supplied via the data-in line 91 from input/output ports on the integrated circuit on die 95 or from other data sources internal or external to the integrated circuit on die 95, to the data-in structures in block 86. In the illustrated embodiment, other circuitry 94 is included on the integrated circuit, such as a general purpose processor or special purpose application circuitry, or a combination of modules providing system-on-a-chip functionality supported by the memory array. Data is supplied via the data-out line 92 from the sense amplifiers in block 86 to input/output ports on the integrated circuit on die 95, or to other data destinations internal or external to the integrated circuit on die 95. The die 95 in this example includes voltage supply or supplies in block 88, which can be used to provide a variety of supply and bias voltages to the row decoder 81 and elsewhere on the chip, such as those utilized in flash memory for read, erase, program, erase verify and program verify voltages.

A controller 89 implemented in this example using a state machine controls the operating modes of the integrated circuit. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

The controller 89 includes a command decoder which is responsive to commands applied on the line 93 to decode a command set for the integrated circuit. For example, for a memory device the command set can include a variety of read, write, register read, register write and so on, type commands. According to technology described herein, the command set also carries commands using access IDs for selecting individual die in a multi-chip package. The controller 89 also includes scan ID/access ID logic which supports the processes described in detail below for assigning access IDs to the die. Embodiments can also include an address generator in the controller 89 used for producing addresses needed to support various operations on the device.

Upon mounting a multi-chip package, the input comprising the data-in line 91, the address line 85, and the command line 93 are shared among the die in the package and together are termed "shared input." In some embodiments, the data, address and command signals are applied on shared lines in a serial fashion, such as can be implemented using serial flash memory devices known in the art.

The die 95 also includes nonvolatile memory 96 adapted to store a first unique ID, termed a scan ID, and nonvolatile memory 97 adapted to store a second unique ID, termed an access ID. The first unique ID is unique within a lot of die, where a lot may include all die on a single wafer, or all die on a group of wafers, which can be tracked during subsequent manufacturing and packaging of the die. The second unique ID is unique within a set of die mounted in a single package, and corresponds with the access IDs used in the command set for selecting individual die within the package. The scan ID memory 96 and the access ID memory 97 can be implemented as memory cells within the array 80, and identified by the controller 89 using a specified array address. Alternatively, the scan ID memory 96 and the access ID memory 97 can be implemented using other nonvolatile memory cells on the die. For example, nonvolatile memory registers can be coupled to the controller 89 and used specifically for these purposes. The IDs can be implemented in nonvolatile registers accessible and implemented in the same manner, or in a similar manner, as status registers and configuration registers on the device.

The scan ID memory 96 in particular, can be configured for access during a wafer sort/test process by a wafer probe. Thus a physical test interface, or other interfaces including for example, special purpose contact pads on the integrated circuit, can be contacted by a wafer probe, and logic on the integrated circuit can be exercised by the wafer sort/test machine to write data in the scan ID memory 96. The physical test interface is implemented on the wafer and/or on the die as specified for the test equipment used in the manufacturing line.

The controller 89, or other on-chip resource, includes scan ID/access ID logic responsive to a first command on the shared input to compare an input scan ID to an assigned first ID stored in the scan ID memory 96. The logic issues a scan ID match signal on the shared input, or otherwise, so that a system assigning access IDs is informed of the match.

The controller 89, or other on-chip resource, includes logic operable in response to a scan ID match to enable writing of a second ID to the access ID memory 97 for a period of time long enough to allow a system assigning access IDs to complete a process using the shared input to write a free access ID into the access ID memory 97. Also, the controller 89, or other on-chip resource, includes logic responsive to commands on the shared input which can be issued by an external machine in response to a scan ID match signal, to write an assigned access ID into the access ID memory during the period of time that the process is enabled. When the access ID write process is not enabled after a scan ID match, the access ID memory 97 can be protected from alteration using the memory lock technologies well known in the art.

Figure 4:
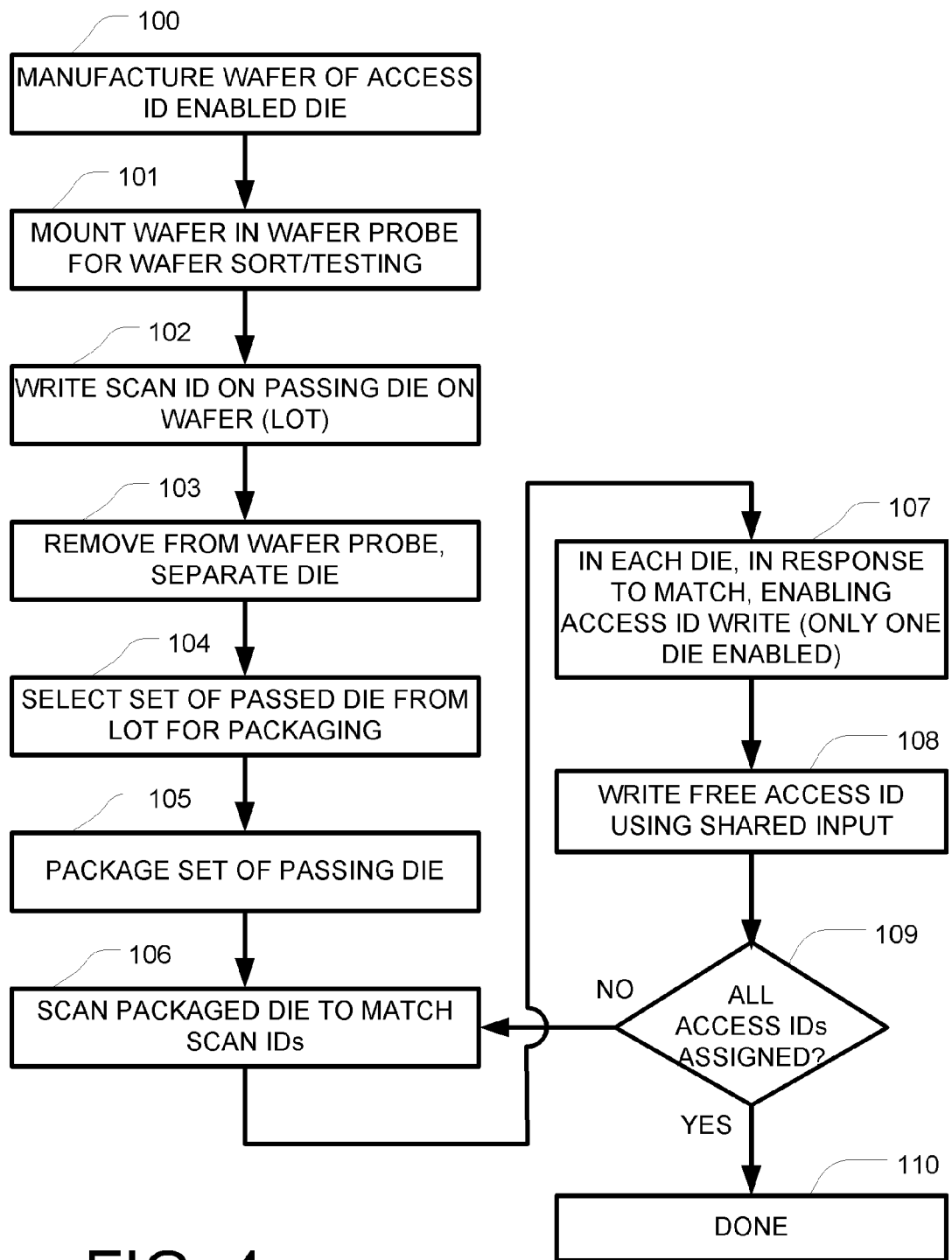
FIG. 4 is a flowchart for a manufacturing process for a multi-chip package as described herein.

FIG. 4 is a flowchart for a representative process for manufacturing integrated circuit devices comprising a multi-chip package as described herein. According to this example, a wafer is manufactured with an array of access ID enabled die, such as the die illustrated with respect to FIG. 3 (100). The wafer is mounted in a wafer probe for wafer sort/test processing (101). Using the wafer probe, a unique ID, within a range of IDs assigned to the lot, is written into the scan ID memory on die which pass the wafer test suite (102). Next, the wafer is removed from the wafer probe and individual die are separated (103). A set of the passing die from the lot is selected for packaging in a single multi-chip package (104). Next, the set of passing die is mounted in a single multi-chip package (105). The die can be mounted in a single multi-chip package using technology that does not distinguish among the die.

Next the finished multi-chip package is mounted in a package testing apparatus where for example final tests are applied. A process is executed to scan the packaged die to match the scan IDs (106). In each die, in response to a match, an access ID write operation is enabled for a period of time which can be a pre-specified amount of time, or an amount of time that varies during processing, lasting until successful writing to of an access ID to the chip or failure of access ID write is signaled (107). Because each die has a unique scan ID within the lot, only one die within the package will be enabled at a time.

Upon detecting a match, a free access ID is written using a shared input for the package (108). Because only one die is enabled to write the access ID, only one die will receive the free access ID in this cycle. The process determines whether all of the access IDs for the package have been assigned (109). If not, then the process returns to block 106, where the process of scanning the die in the package to match the scan IDs is continued. If at step 109, all of the access IDs have been assigned, then the process is done (110). Although not shown in the diagram, if all of the scan IDs for the lot had been sequenced through the package, and all of the access IDs have not been successfully assigned, then the process fails.

Figure 5:
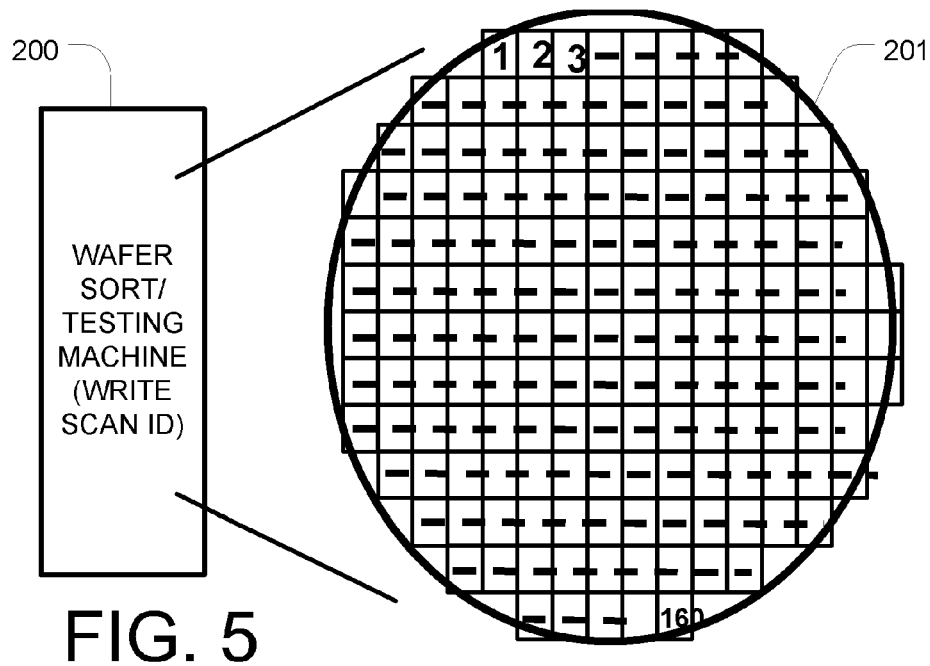
FIG. 5 is a schematic diagram of a wafer sort/test machine and wafer, where the wafer sort/test machine writes scan IDs to die on the wafer using a wafer probe.

FIG. 5 is a simplified schematic showing a wafer sort/test machine 200 and a wafer 201 having a plurality of die formed thereon. The die are undistinguished as manufactured, as described above with reference to FIG. 3. The wafer sort/test machine 200 is enabled to write scan IDs to individual die in the wafer 201, so that a sequence of scan IDs is written to a lot. As explained above, a lot for the purposes of techniques for a signing access IDs described herein can include all of the die on a single wafer, all of the die on a number of wafers, or a subset of die as suits particular a manufacturing line supporting multi-chip packaging. In this example, each of the individual die in the wafer 201 which passes the wafer sort/test sequences is assigned a unique scan ID for the lot in sequence, including scan ID 1, scan ID 2, scan ID 3, . . . scan ID 160.

Figure 6:
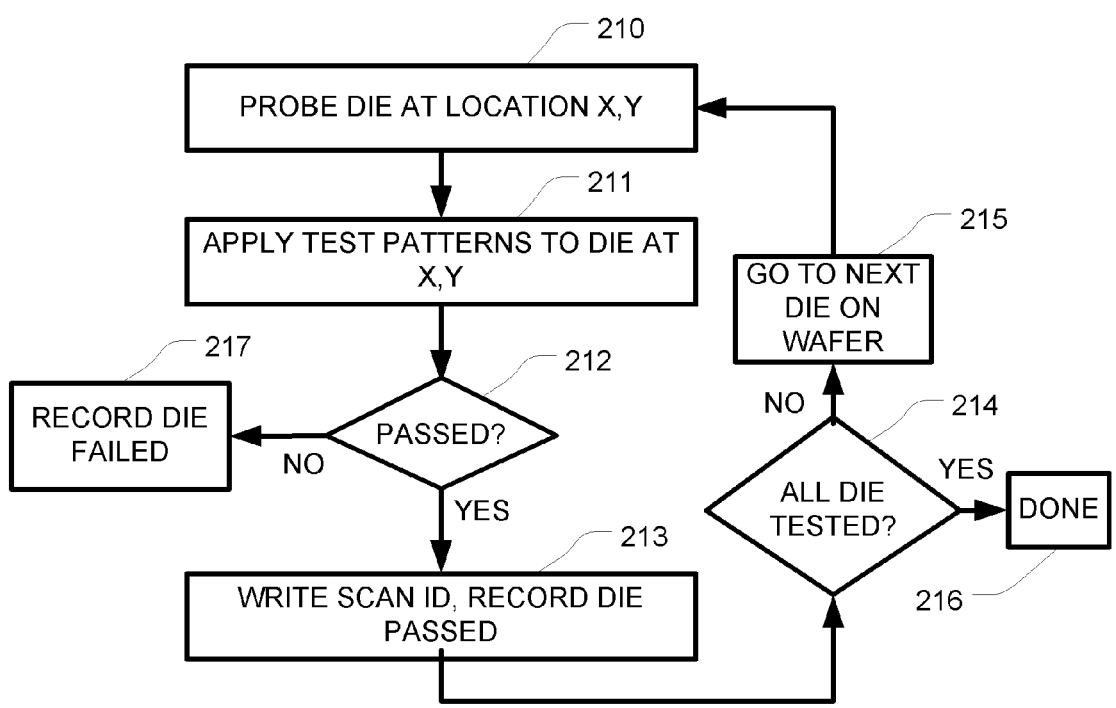
FIG. 6 is a flowchart of a process executable by a wafer sort/test machine to assign scan IDs to die in a die lot.

FIG. 6 is a flowchart of a process executed by the wafer sort/test machine 200. The process involves probing a die at a specific location (x,y) on the wafer (210). Test suites are applied to the die (211). The algorithm determines whether the die at the specific location passed the test suites (212). If the die passes, then a scan ID is written to nonvolatile memory on the die, and the die is marked or recorded as a passing die (213). Next, the process determines whether all of the die on the wafer have been processed for assigning scan IDs (214). If not, then the probe is move to the next die on the wafer (215), and the process loops back to block 210. If at block 212, the die does not pass, then the die is marked as a failed die so that it can be discarded, or otherwise handled, after separation from the wafer (217). Also, if at block 214, it is determined that all of the die on the wafer have been tested, then the process is done (216).

Figure 7:
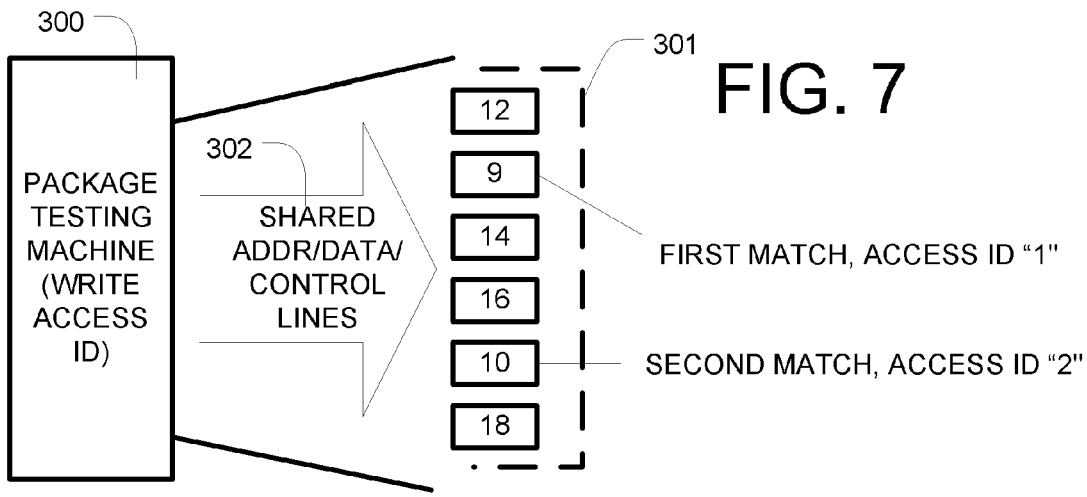
FIG. 7 is a schematic diagram of a package testing machine and a multi-chip package in which die have unique scan IDs, and where the package testing machine assigns access IDs to die within the package using shared input.

FIG. 7 is a simplified schematic showing a package testing machine 300 and a multi-chip package 301 having a set of die having scan IDs 12, 9, 14, 16, 10 and 18. Also, the die in the multi-chip package 301 have shared input 302. The die are undistinguished as manufactured as described above with reference to FIG. 3, but have unique scan IDs within the lot from which they were selected. The manner in which the die are mounted within the multi-chip package 301 is not required to distinguish among the die, and in preferred systems does not. After execution of the process described above, each die in the package 301 receives a unique access ID. As indicated in FIG. 7 for example, the die having the first matching scan ID in the sequence, which in this example is 9, is assigned the first access ID in a set of free access IDs, such as access ID "1". The die having a second matching scan ID in the sequence, which in this example is 10, is assigned a second access ID in the set of free access IDs, such as access ID "2".

Figure 8:
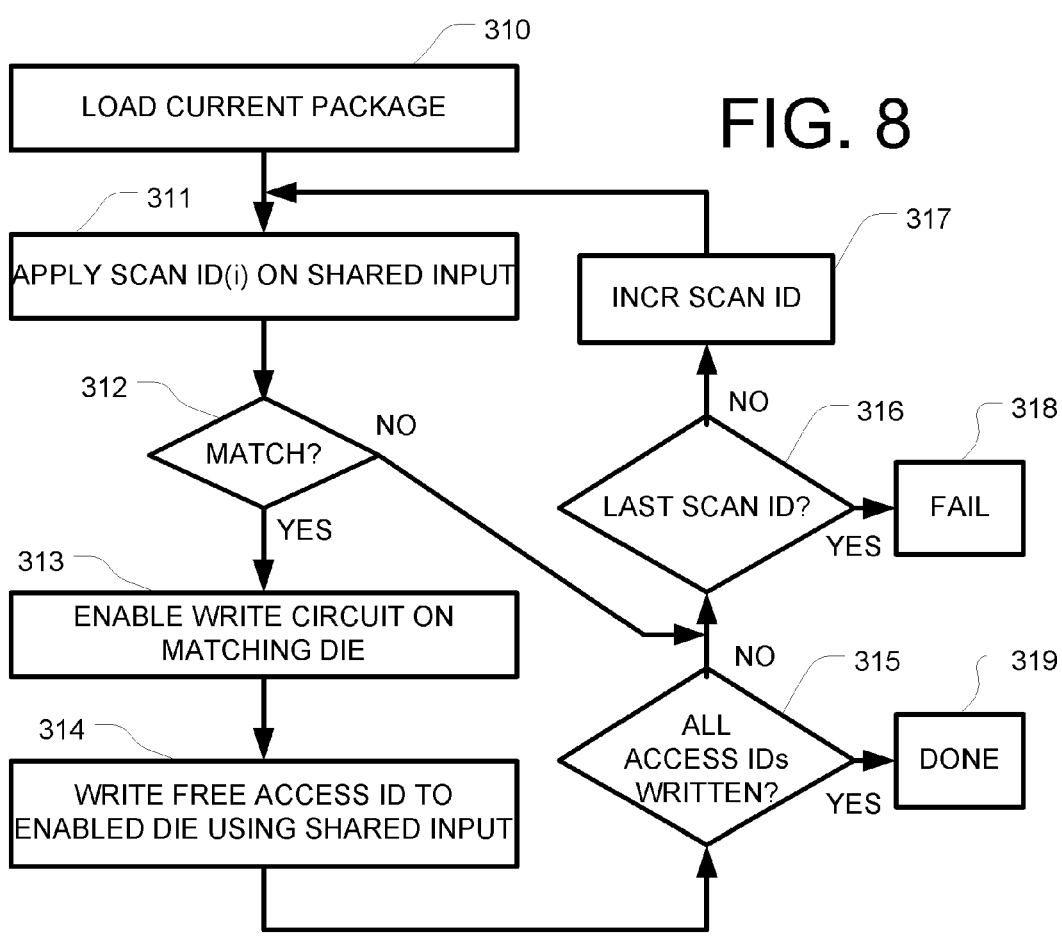
FIG. 8 is a flowchart of the process executable by a package testing machine to assign access IDs to die within a package.

FIG. 8 is a flowchart of a process executed by a package testing machine 300. The process involves first loading a current package in the machine (310). Next, scan ID (i), where (i) is an index keeping track of the scan IDs assigned in the lot, is applied on the shared input of the multi-chip package. The process determines whether a match is detected (312), such as by detecting a signal from the shared lines coupled to the multi-chip package. If a match is detected, circuitry on the die which detects a match is enabled for writing an access ID into nonvolatile memory (313). On the die that do not match the current scan ID (i), the circuitry for writing the access ID is not enabled. Thereby, only one die in the package is enabled to receive an access ID in response to a match on a specific scan ID. The package testing machine 300 writes a free access ID to the enabled die using the shared input (314). Next the process determines whether all access IDs for the package have been written (315). If not, then the process determines whether the last scan ID within the lot has been tested (316). If the last scan ID has not been tested, then the scan ID is incremented (317), and the process loops back to step 311 to continue applying scan IDs. If all the all the access IDs have been written for the multichip package at block 315, then the process is done (319). If all the scan IDs for the lot have been used at block 316 without successfully assigning all the access IDs, then the to process fails (318).

An integrated circuit is described here which supports a process for mounting a die in a multi-chip package, where the die is undistinguished during manufacturing and can be mounted in a package in an unspecified location, and with undistinguished input/output. In an example described here, the die are implemented with circuitry supporting a process in which the unique scan ID is assigned for each die and stored in nonvolatile memory on the die during a wafer sort/test stage of manufacturing. During a package testing stage, the scan IDs are used to support a process to scan for matching scan IDs in the package. Once an ID is matched, the matched die can be programmed with a unique access ID.

During operation in the field, a command set is utilized that takes advantage of the unique access ID to access each individual die in the package. Thus a method for operating a device in a multi-chip package comprising a plurality of dies each of which stores a unique assigned ID, comprises receiving a command on shared input, such as a serial port, having a first part indicating an operation mode and a second part indicating an access ID; and comparing the access ID with the assigned ID of each die and responding to the command upon a matching die.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit device, comprising:
a set of die coupled to shared input lines having an operating mode relying on selecting individual die in the set, each die in the plurality of die including:
nonvolatile memory storing a first ID unique within a lot of die, and adapted to store a second ID unique within the set of die;
control logic to compare an input scan ID on the shared input lines to the first ID stored in the nonvolatile memory, and in response to a match, to enable writing of the second ID to the nonvolatile memory; and
logic responsive, during a period of time after said enabling, to a second command to write an assigned ID received on the shared input lines into the nonvolatile memory as the second ID.

2. The device of claim 1, wherein die in the set of die comprise parts of a wafer, said control logic capable of writing the first ID to the nonvolatile memory before separation from the wafer.

3. The device of claim 1, wherein said control logic further responds to signals on the shared input lines based on the assigned second ID.

4. The device of claim 1, wherein said integrated circuit device responds to a command having a first part indicating an operation mode and a second part indicating the second ID.

5. The device of claim 1, wherein said die in the set of die comprise integrated circuit memory devices including respective arrays of nonvolatile memory cells, and wherein said nonvolatile memory storing the first ID comprises memory cells in said respective arrays.

6. The device of claim 1, wherein said die in the set of die comprise integrated circuit memory devices including respective arrays of nonvolatile memory cells, and wherein said nonvolatile memory storing the first ID and the second ID comprises memory cells in said respective arrays.

7. A method for manufacturing a multi-chip package including die having shared input, unique first IDs stored thereon and access IDs that distinguish among the die in the package, comprising:
assigning free access IDs to the set of die selected from a set of access IDs for die in the package until the set of access IDs is assigned, by
(i) applying a sequence of scan IDs on the shared input;
(ii) on each die in the set, comparing the scan ID with the unique first ID stored on the die and upon detecting a match, signaling a scan ID match and enabling circuitry on the die to write an access ID in nonvolatile memory on the die using the shared input, whereby one of the die is enabled at a time; and
(iii) when a scan ID match is signaled, using the shared input to write a free access ID in nonvolatile memory on the one enabled die in the set, and then continuing until the set of access IDs is assigned.

8. The method of claim 7, including:
storing said unique first IDs in die in a die lot;
mounting a set of die from the die lot in a multi-chip package in which the set of die have a plurality of shared inputs.

9. The method of claim 8, including executing a wafer level sort process that applies a test suite, and storing said unique first IDs on die which pass the test suite.

10. The method of claim 7, including assigning free access IDs during a package test process.

11. An integrated circuit device, comprising:
a set of die coupled to shared input lines having an operating mode relying on selecting individual die in the set, each die in the plurality of die including:
nonvolatile memory storing a first ID unique within a lot of die, and adapted to store a second ID unique within the set of die; and
control logic to compare an input scan ID on the shared input lines to the first ID stored in the nonvolatile memory, and in response to a match, to enable writing of the second ID to the nonvolatile memory, wherein said die in the set of die comprise integrated circuit memory devices including respective arrays of nonvolatile memory cells, and wherein said nonvolatile memory storing the first ID and the second ID comprises memory cells in said respective arrays.

* * * * *